(12) United States Patent (10) Patent No.: US 7,076,374 B2
Rogovin (45) Date of Patent: Jul. 11, 2006

(54) METHODS AND SYSTEMS FOR DETECTING AND LOCATING DAMAGE IN A WIRE

(75) Inventor: Daniel N. Rogovin, Newbury Park, CA (US)

(73) Assignee: The Boeing Company, Seattle, WA (US)

( * ) Notice: Subject to any disclaimer, the term of this patent is extended or adjusted under 35 U.S.C. 154(b) by 27 days.

(21) Appl. No.: 10/901,878

(22) Filed: Jul. 29, 2004

(65) Prior Publication Data

US 2006/0025941 A1 Feb. 2, 2006

(51) Int. Cl.
*G01R 31/08* (2006.01)
(52) U.S. Cl. .............. 702/59; 702/58; 702/57; 702/65; 324/520; 324/525; 324/544
(58) Field of Classification Search .............. None
See application file for complete search history.

(56) References Cited

U.S. PATENT DOCUMENTS

| | | | | |
|---|---|---|---|---|
| 4,236,160 | A * | 11/1980 | Johnson | 343/743 |
| 5,047,724 | A * | 9/1991 | Boksiner et al. | 324/520 |
| 5,699,402 | A * | 12/1997 | Bauer et al. | 379/29.09 |
| 5,977,773 | A * | 11/1999 | Medelius et al. | 324/520 |
| 6,144,721 | A * | 11/2000 | Stephens | 379/21 |
| 6,177,801 | B1 * | 1/2001 | Chong | 324/520 |
| 6,417,672 | B1 * | 7/2002 | Chong | 324/520 |
| 6,580,783 | B1 * | 6/2003 | Swale | 379/26.01 |
| 6,763,108 | B1 * | 7/2004 | Stephens | 379/399.01 |
| 6,914,963 | B1 * | 7/2005 | Peoples | 379/22.03 |
| 2002/0012540 | A1 * | 1/2002 | Saha et al. | 396/661 |
| 2003/0001556 | A1 * | 1/2003 | Doany et al. | 324/67 |

* cited by examiner

*Primary Examiner*—Carol S. W. Tsai
(74) *Attorney, Agent, or Firm*—Sonnenschein Nath & Rosenthal LLP

(57) ABSTRACT

Methods, systems, and articles of manufacture consistent with the present invention provide for identifying and locating wire damage on a wire. Broadband impedance phase and magnitude information for the wire is obtained. Potential wire damage on the wire is identified by analyzing the wire's low-frequency impedance phase information. The location of the wire damage is found by analyzing the wire's low-frequency impedance magnitude information.

14 Claims, 6 Drawing Sheets

LOW-FREQUENCY IMPEDANCE PHASE SPECTRUM

US 7,076,374 B2

METHODS AND SYSTEMS FOR DETECTING AND LOCATING DAMAGE IN A WIRE

GOVERNMENT CONTRACT

This invention was made with Government support under Contract No. DTFA-03-C-00014 awarded by the FAA. The Government has certain rights in this invention.

BACKGROUND OF THE INVENTION

The present invention generally relates to the field of electrical wire testing and, more particularly, to methods and systems for detecting and locating damage in a wire using broadband impedance.

Damaged wiring can lead to detrimental conditions, such as short circuits. When the damaged wiring is located in, for example, commercial or military aircraft, space vehicles, or nuclear power plants, the damaged wiring can lead to serious problems.

Conventional approaches for determining whether a wire is damaged include hi-pot and wire insulation tests. Although these conventional methods are effective to detect damage in a wire, such as short circuits using the hi-pot test or damaged insulation using the wire insulation test, the conventional tests can break or damage the wire. For example, to perform a hi-pot test, a high voltage of 500V is typically applied to the wire, which can damage a frail wire or thin conductor. Further, conventional approaches determine whether a wire is damaged, but fail to provide a location of the damage.

SUMMARY OF THE INVENTION

Methods, systems, and articles of manufacture consistent with the present invention detect and locate damage in a wire from the wire's broadband impedance.

In accordance with methods consistent with the present invention, a method in a data processing system having a program for identifying a wire damage on a wire is provided. The method comprises the steps of: obtaining a broadband impedance phase information for the wire, and determining whether the wire is damaged based on an impedance phase value of the wire at low frequency.

In accordance with articles of manufacture consistent with the present invention, a computer-readable medium containing instructions that cause a data processing system having a program to perform a method for identifying a wire damage on a wire to perform a program is provided. The method comprises the steps of: obtaining a broadband impedance phase information for the wire, and determining whether the wire is damaged based on an impedance phase value of the wire at low frequency.

In accordance with systems consistent with the present invention, a data processing system for identifying a wire damage on a wire is provided. The data processing system comprises: a memory comprising a program that obtains a broadband impedance phase information for the wire, and determines whether the wire is damaged based on an impedance phase value of the wire at low frequency; and a processing unit that runs the program.

In accordance with systems consistent with the present invention, a data processing system for identifying a wire damage on a wire is provided. The data processing system comprises: means for obtaining a broadband impedance phase information for the wire, and means for determining whether the wire is damaged based on an impedance phase value of the wire at low frequency.

Other features of the invention will become apparent to one with skill in the art upon examination of the following figures and detailed description. It is intended that all such additional systems, methods, features and advantages be included within this description, be within the scope of the invention, and be protected by the accompanying drawings.

BRIEF DESCRIPTION OF THE DRAWINGS

The accompanying drawings, which are incorporated in and constitute a part of this specification, illustrate an implementation of the invention and, together with the description, serve to explain the advantages and principles of the invention. In the drawings.

DETAILED DESCRIPTION OF THE INVENTION

Reference will now be made in detail to an implementation in accordance with methods, systems, and articles of manufacture consistent with the present invention as illustrated in the accompanying drawings. Wherever possible, the same reference numbers will be used throughout the drawings and the following description to refer to the same or like parts.

Methods, systems, and articles of manufacture consistent with the present invention detect and locate damage in a wire from a single measurement point using the wire's measured broadband impedance.

Figure 1:
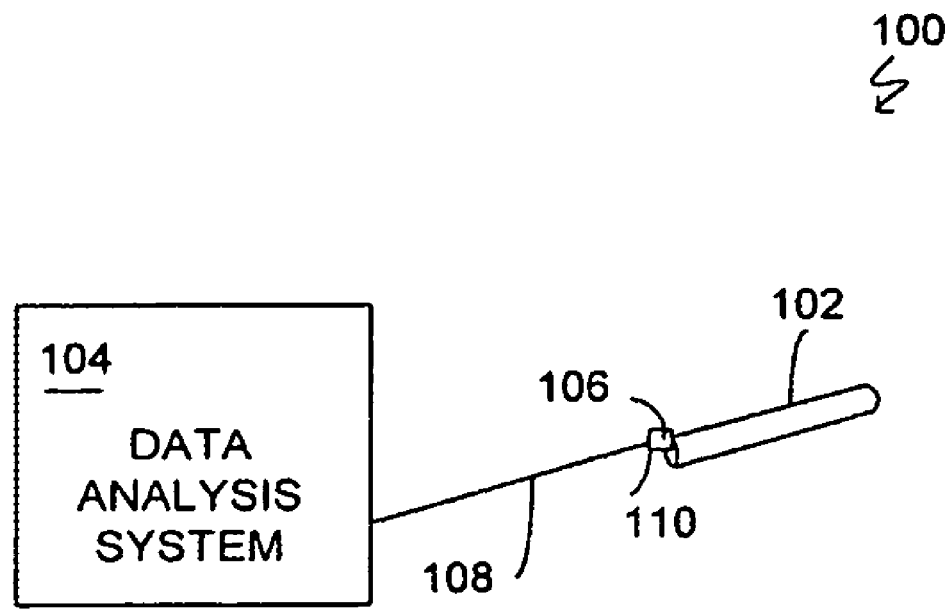
FIG. 1 is a schematic diagram of a system for identifying and locating a wire damage on a wire consistent with the present invention.

FIG. 1 depicts a block diagram of a system 100 for detecting and locating wire damage in a wire consistent with the present invention. As illustrated, the system 100 generally comprises a wire 102, which may be damaged, for example, by a short-circuit or degraded insulation. A data analysis system 104 is connected to a measurement point 106 of wire 102 via a cable 108. Cable 108 electrically couples to wire 102 via one or more connectors 110, such as a banana clip or other type of connector. Data analysis system 104 measures the broadband impedance of wire 102, determines whether there is damage in the wire, and locates the damage based on the measured broadband impedance. Further, data analysis system 104 determines the location of the damage at any point in the wire using the measured broadband impedance obtained from the single measurement point 106.

Figure 2:
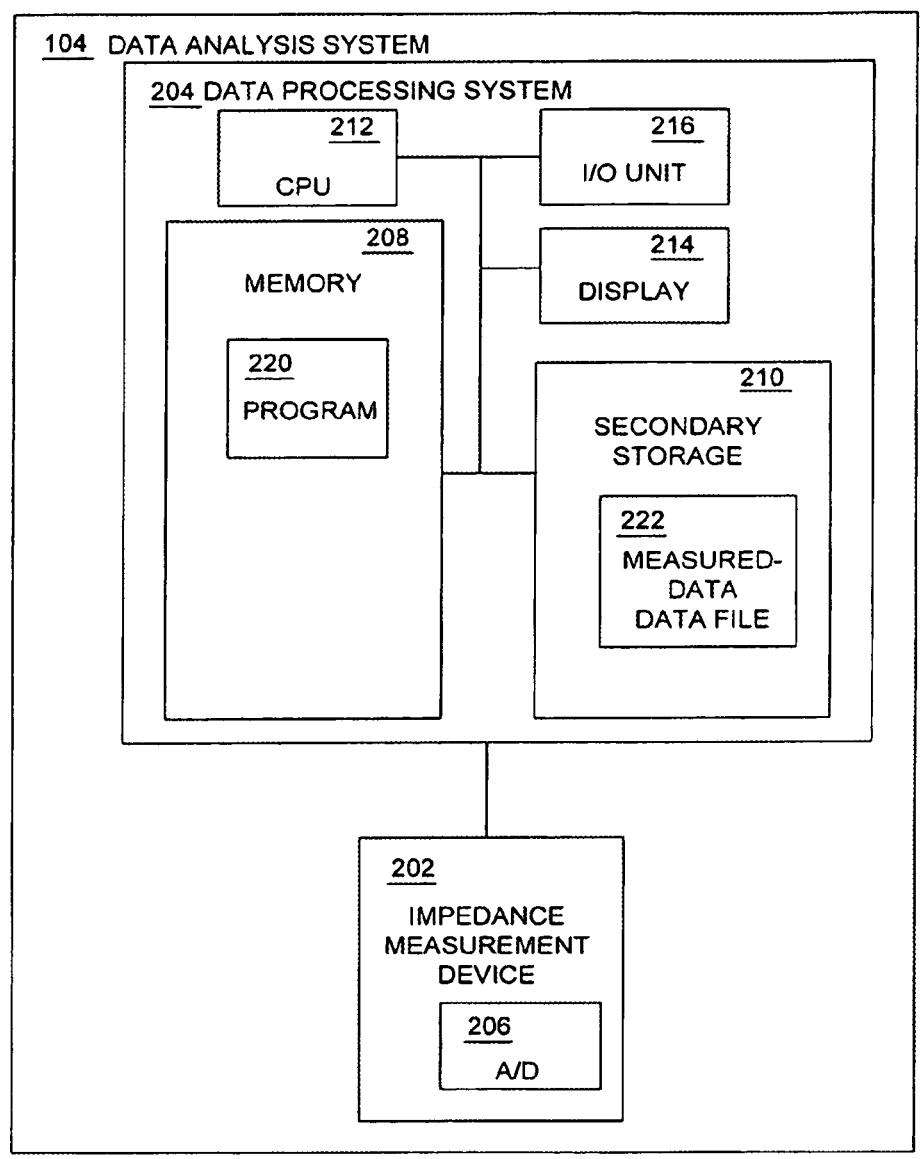
FIG. 2 is a block diagram of a data analysis system consistent with the present invention.

FIG. 2 depicts data analysis system 104 in more detail. Data analysis system 104 comprises an impedance measurement device 202 and a data processing system 204. Impedance measurement device 202 measures the magnitude and phase of the broadband impedance of wire 102, and can be a suitable off-the-shelf impedance measurement device. For example, the impedance measurement device can be, but is not limited to, the 4294A Precision Impedance Analyzer manufactured by Agilent Technologies, Inc. of Palo Alto, Calif., U.S.A. As impedance measurement devices are known to one having skill in the art, the impedance measurement device will not be described in further detail.

During operation, the impedance measurement device outputs a low-voltage output signal, which is transmitted through wire 102 via cable 108. The frequency of the output signal is adjusted so that impedance measurement device 202 measures the frequency-dependant impedance of wire 102 across a range of frequencies, such as from about 0 Hz to about 10 kHz. The measured impedance information is converted to a digital signal by an analog-to-digital converter 206 and output from the impedance measurement device. Once the signal is in a digital form, it can be processed by data processing system 204. Collected impedance information may be archived in a memory 208 or a secondary storage 210 of data processing system 204.

One having skill in the art will appreciate that the data acquisition and data collection functionality of data analysis system 102 can be included in a device separate from data processing system 204. The separate device would comprise an impedance measurement system having an analog-to-digital converter, a processing unit, and a memory. The collected data would be stored on the separate device during data acquisition and transferred to the data processing system 204 for processing.

Data processing system 204 comprises a central processing unit (CPU) or processor 212, a display device 214, an input/output (I/O) unit 216, secondary storage device 210, and memory 208. The data processing system may further comprise standard input devices such as a keyboard, a mouse or a speech processing means (each not illustrated).

Memory 208 comprises a program 220 for identifying and locating damage in a wire, such as wire 102. In an illustrative example, program 220 is implemented using MAT-LAB® software, however, the program can be implemented using another application program or another programming language. As will be described in more detail below, the program analyzes the low-frequency portion of the phase of the wire's broadband impedance information to determine whether there is wire damage, and analyzes the low-frequency portion of the magnitude of the wire's broadband impedance information to locate the damage. MATLAB is a United States registered trademark of The MathWorks, Inc. of Natwick, Mass.

One having skill in the art will appreciate that the program can reside in memory on a system other than data processing system 204. Program 220 may comprise or may be included in one or more code sections containing instructions for performing their respective operations. While program 220 is described as being implemented as software, the present implementation may be implemented as a combination of hardware and software or hardware alone. Also, one having skill in the art will appreciate that program 220 may comprise or may be included in a data processing device, which may be a client or a server, communicating with data processing system 204. Further, data analysis system 104 can itself be an impedance measurement device.

Although aspects of methods, systems, and articles of manufacture consistent with the present invention are depicted as being stored in memory, one having skill in the art will appreciate that these aspects may be stored on or read from other computer-readable media, such as secondary storage devices, like hard disks, floppy disks, and CD-ROM; a carrier wave received from a network such as the Internet; or other forms of ROM or RAM either currently known or later developed. Further, although specific components of data processing system 204 have been described, one having skill in the art will appreciate that a data processing system suitable for use with methods, systems, and articles of manufacture consistent with the present invention may contain additional or different components.

Data processing system 204 can itself also be implemented as a client-server data processing system. In that case, program 220 can be stored on the data processing system as a client, while some or all of the steps of the processing described below can be carried out on a remote server, which is accessed by the client over a network. The remote server can comprise components similar to those described above with respect to the data processing system, such as a CPU, an I/O, a memory, a secondary storage, and a display device.

Figure 3:
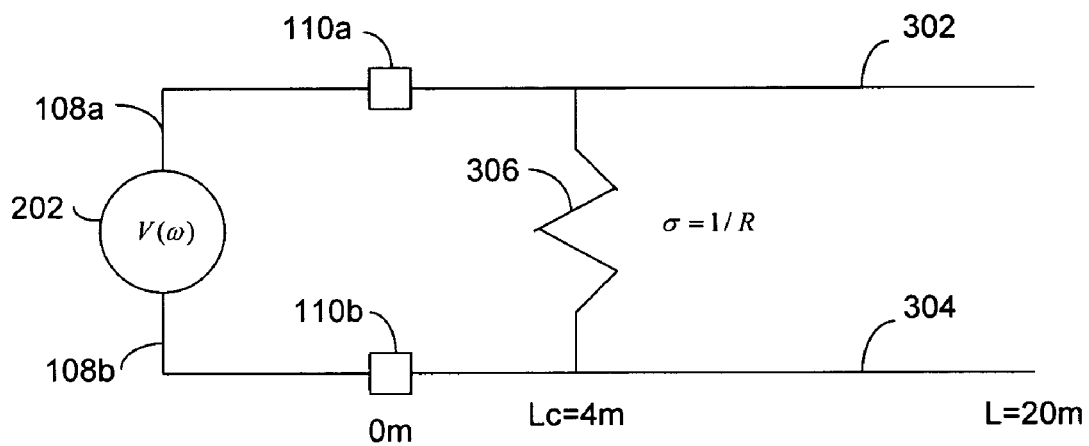
FIG. 3 is a detail of the wire of FIG. 1.

FIG. 3 depicts the illustrative wire 102 in more detail. As shown, the illustrative wire comprises two conductors 302 and 304, which are illustratively arranged in a twisted-pair configuration. Alternatively, conductors 302 and 304 can be arranged in a different configuration, such as a coaxial or parallel-spaced conductor configuration. Conductors 302 and 304 are preferably insulated. The wire has a length (L), which is 20 meters in the illustrative example. Wire damage 306 is present in the wire at location $L_c$ and represents, for example, a short circuit, damaged insulation, or another type of defect. In the illustrative example, the wire damage is a conductive path between conductors 302 and 304 of the wire and represents a conductance $\sigma=1/$resistance R. In the illustrative example, the wire damage is located at $L_c=4$ meters and the resistance at the wire damage R=1 GΩ.

Impedance measurement device 202 transmits the low-voltage signal to wire 102 via conductors 108a and 108b of cable 108. As shown, conductors 108a and 108b of cable 108 connect to the conductors of wire 102 via respective connectors 110a and 110b. The low-voltage signal from the impedance measurement device has a potential of, for example, a few volts. Thus, there is a lower risk of damaging the wire with low-voltage signal consistent with the present invention than with conventional test signals that typically have a potential of around 500 volts.

Figure 4:
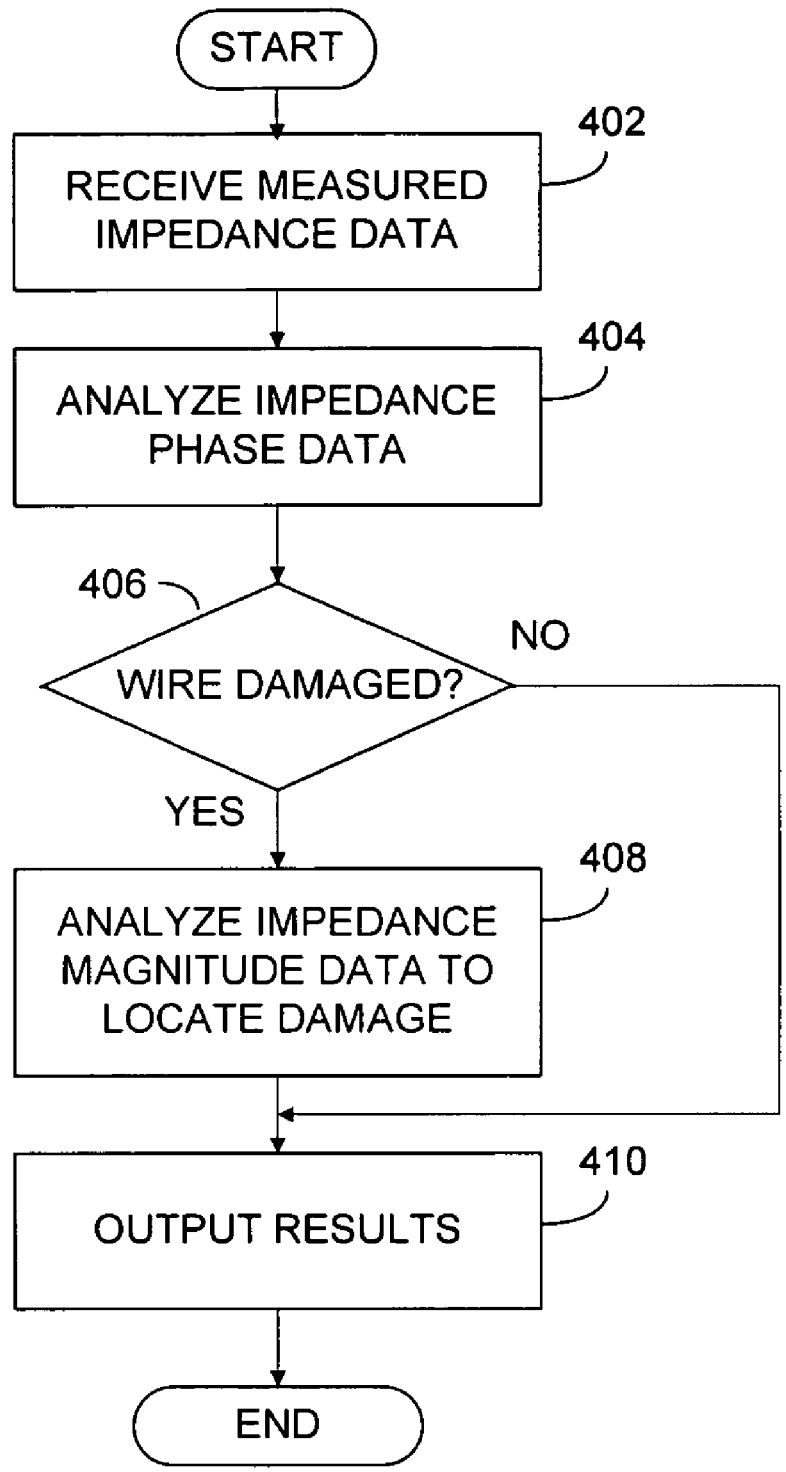
FIG. 4 is a flow diagram of the exemplary steps for identifying and locating the wire damage on the wire consistent with the present invention.

FIG. 4 depicts a flow diagram illustrating the exemplary steps performed by program 220 for detecting and locating wire damage, such as wire damage 306, on a wire. As will be described in more detail below, the program analyzes the low-frequency portion of the phase of the wire's measured broadband impedance information to determine whether there is wire damage, and analyzes the low-frequency portion of the magnitude of the wire's measured broadband impedance information to locate the damage. First, the program receives the measured impedance information for the wire (step 402). The measured impedance information can be received, for example, as a data file in the memory or in the secondary storage. Alternatively, the program can measure the measured impedance over a predetermined range of frequencies and store the frequency-dependent impedance magnitude and phase spectra, for example, in the memory or the secondary storage. In the illustrative example, the impedance measurement device measures the frequency-dependent impedance magnitude and phase spectra and transfers the information to the data processing system, where the information is saved in a measured-data data file 222 in the secondary storage.

Through extensive experimentation, the inventor has discovered that the low-frequency portion of the phase of the wire's measured broadband impedance spectrum is sensitive to damage on the wire. If the wire is undamaged, the wire's measured impedance phase spectrum is relatively flat at around −90° over a range of low frequencies, such as from about 1 kHz to about 10 kHz. However, if the wire is damaged, then the wire's measured impedance phase deviates from −90° in the low-frequency range, such as from about 1 kHz to about 10 kHz. Further, the greater the conductance at the point of damage, the greater the wire's impedance phase generally deviates from −90° to 0° at 1 Hz.

Figure 5:
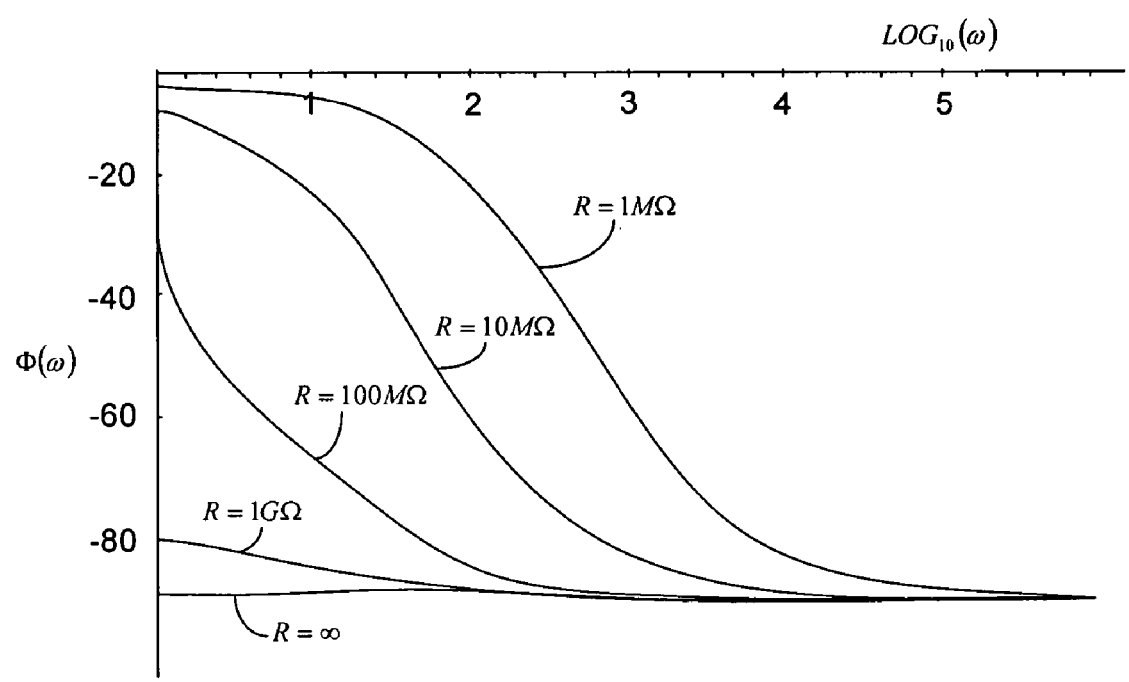
FIG. 5 shows illustrative measured low-frequency impedance phase spectra for the wire of FIG. 1.

FIG. 5 depicts illustrative frequency-dependent impedance phase spectra for the wire for cases in which the wire damage has a resistance R=1 MΩ, 10 MΩ, 100 MΩ, 1 GΩ, and baseline (i.e., no damage). As shown in FIG. 5, the wire damage impresses its signature on the low-frequency portion (e.g., about 1 kHz to about 10 kHz) of the impedance phase spectrum. The lower the resistance, the greater the impedance phase generally deviates from −90° to 0° at 1 Hz. As shown, at 1 Hz, when R=1 MΩ the impedance phase is around −1°, when R=10 MΩ the impedance phase is around −40, when R=100 MΩ the impedance phase is around −30°, when R=1 GΩ the impedance phase is around −80°, and when R=∞ (i.e., no damage (baseline)) the impedance phase is around −90°.

The frequency-dependent impedance phase spectrum for the wire in the illustrative example is thus depicted in FIG. 5 as the case in which the wire damage has a resistance of R=1 GΩ. The program determines whether there is wire damage by analyzing the wire's measured impedance phase at a predetermined frequency, such as 1 Hz (step 404). If the wire's impedance phase at 1 Hz is not equal to −90°, then the program determines that there is wire damage (step 406). Alternatively, the program can analyze the measured impedance phase to determine whether it has a value within a predetermined range (e.g., less than −90°) at a predetermined frequency (e.g., 1 Hz). Also, the program can alternatively calculate the average impedance phase over a range of frequencies (e.g., about 0 Hz to about 10 Hz or higher) and determine whether the average impedance phase has a particular value or is within a predetermined range.

In the illustrative example, the program should determine that the wire is damaged, because the wire's measured impedance phase has a value of around −80° at 1 Hz.

If the program determined that there is wire damage in step 406, then the program locates the position of the wire damage on the wire by analyzing the wire's impedance magnitude information (step 408). Through extensive experimentation, the inventor has discovered the low-frequency portion of the magnitude of the wire's measured broadband impedance spectrum is sensitive to damage on the wire. For a low-frequency range of, for example, from about 0 Hz to about 1 Hz, the wire's impedance magnitude spectrum exhibits characteristics such that the distance from the measurement point to the wire damage can be found using Equation (1).

$$L_c = L|Z(\omega)|/R \qquad \text{Equation (1)}$$

In Equation (1), $L_c$ represents the distance from the measurement point to the wire damage, L represents the length of the wire, $|Z(\omega)|$ represents the magnitude of the measured impedance at a frequency, and R represents the resistance at the wire damage. Accordingly, at a particular low frequency, such as 1 Hz, $|Z(\omega)|/R=0$ when $L_c=0$ (i.e., the measurement point is at the wire damage) and $|Z(\omega)|/R=1$ when $L_c=L$ (i.e., the measurement point is the furthest possible distance from the measurement point). Thus, the value of $|Z(\omega)|/R$ increases proportionally from 0 to 1 as the distance of the wire damage increases from the measurement point to the furthest possible distance on the wire from the measurement point.

Figure 6:
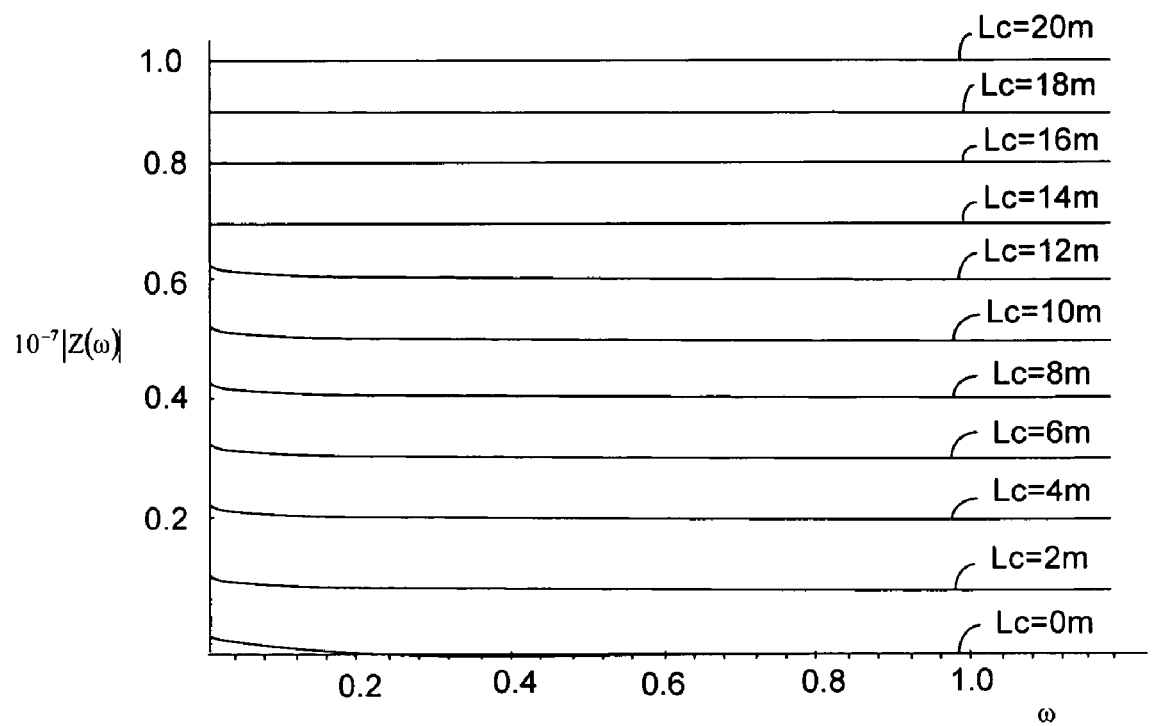
FIG. 6 shows illustrative measured low-frequency impedance magnitude spectra for the wire of FIG. 1.

FIG. 6 depicts illustrative frequency-dependent impedance magnitude spectra for the illustrative 20 meter wire for cases in which the wire damage is located at distances of $L_c$=0 m, 2 m, 4 m, 6 m, 8 m, 10 m, 12 m, 14 m, 16 m, 18 m, and 20 m from the measurement point. As shown in FIG. 6, the wire damage impresses its signature on the low-frequency portion (e.g., about 0 Hz to about 1 Hz) of the impedance magnitude spectrum responsive to the distance of the wire damage from the measurement point. In the illustrative spectra of FIG. 6, as the position of the wire damage moves farther away from the measurement point, the value of $|Z(\omega)|/R$ increases from 0 to 1. The illustrative values of $|Z(\omega)|/R$, with ω=1 Hz and L=20 m, are reproduced from FIG. 6 in Table (1):

TABLE 1

| $L_c$ (meters) | $|Z(\omega)|/R$ |
|---|---|
| 0.0 | 0.0 |
| 2.0 | 0.1 |
| 4.0 | 0.2 |
| 6.0 | 0.3 |
| 8.0 | 0.4 |
| 10.0 | 0.5 |
| 12.0 | 0.6 |
| 14.0 | 0.7 |
| 16.0 | 0.8 |
| 18.0 | 0.9 |
| 20.0 | 1.0 |

The measured frequency-dependent impedance magnitude spectrum for the wire in the illustrative example, which wire has a length L=20 m and wire damage at $L_c$=4 m, is thus depicted in FIG. 6 as the case in which the location of the wire damage $L_c$=4 m. Therefore, in step 408, the program uses Equation (1), with the wire's impedance magnitude data at ω=1 Hz, to identify that the wire damage is 4 meters from the measurement point.

After determining that the wire is not damaged in step 406 or after finding the location of the wire damage in step 408, the program then outputs the result of its analyses, for example, on the display device (step 410). The results include, for example, an indication of whether there is wire damage and the location of the potential wire damage. In the illustrative example, the program displays information on the display device indicating that there is wire damage 4 meters from the measurement point on the wire.

Therefore, methods, systems, and articles of manufacture consistent with the present invention provide identifying and locating wire damage on a wire. Further, the wire damage is analyzed from a single measurement point using a low voltage signal, which reduces the risk of damaging the wire during analysis.

As an alternative to using the program to find the location of a short circuit, one having skill in the art will appreciate that the user can also identify and locate wire damage on a wire by visually inspecting either the graphical or numerical representations of the broadband impedance magnitude and phase spectra and using Equation (1).

The foregoing description of an implementation of the invention has been presented for purposes of illustration and description. It is not exhaustive and does not limit the invention to the precise form disclosed. Modifications and variations are possible in light of the above teachings or may be acquired from practicing the invention. For example, the described implementation includes software but the present implementation may be implemented as a combination of hardware and software or hardware alone. Further, the illustrative processing steps performed by the program can be executed in an different order than described above, and additional processing steps can be incorporated. The invention may be implemented with both object-oriented and non-object-oriented programming systems. The scope of the invention is defined by the claims and their equivalents.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense

What is claimed is:

1. A method in a data processing system having a program for identifying wire damage on a wire, the method comprising the steps of:
    obtaining a broadband impedance phase information for the wire;
    determining whether the wire is damaged based on an impedance phase value of the wire at low frequency;
    obtaining a broadband impedance magnitude information for the wire; and
    when it is determined that the wire is damaged, determining a location of the wire damage based on an impedance magnitude value of the wire at low frequency by calculating a distance from a measurement point of the broadband impedance magnitude information to the wire damage using Equation (1)

$L_c = L|Z(\omega)|/R$ Equation (1), wherein $L_c$ represents the distance from a measurement point of the broadband impedance magnitude information to the wire damage. L represents a length of the wire, $|Z(\omega)|$ represents the broadband impedance magnitude information at a predetermined frequency $\omega$, and R represents a resistance at the wire damage.

2. A method of claim 1 wherein the step of determining whether the wire is damaged comprises determining whether the impedance phase value of the wire at low frequency deviates from a predetermined impedance phase value.

3. A method of claim 2 wherein the low frequency is less than or equal to about 10 kHz.

4. A method of claim 2 wherein the predetermined impedance phase value is less than or equal to about 90 degrees.

5. A method of claim 1 wherein the predetermined frequency is less than or equal to around 1 Hz.

6. A method of claim 1 further comprising the step of outputting a result of the determination.

7. A computer-readable medium containing instructions that cause a data processing system having a program to perform a method for identifying a wire damage on a wire, the method comprising the steps of:
    obtaining a broadband impedance phase information for the wire;
    determining whether the wire is damaged based on an impedance phase value of the wire at low frequency;
    obtaining a broadband impedance magnitude information for the wire; and
    when it is determined that the wire is damaged, determining a location of the wire damage based on an impedance magnitude value of the wire at low frequency by calculating a distance from a measurement point of the broadband impedance magnitude information to the wire damage using Equation (1)

$L_c = L|Z(\omega)|/R$ Equation (1), wherein $L_c$ represents the distance from a measurement point of the broadband impedance magnitude information to the wire damage, L represents a length of the wire, $|Z(\omega)|$ represents the broadband impedance magnitude information at a predetermined frequency $\omega$, and R represents a resistance at the wire damage.

8. A computer-readable medium of claim 7 wherein the step of determining whether the wire is damaged comprises determining whether the impedance phase value of the wire at low frequency deviates from a predetermined impedance phase value.

9. A computer-readable medium of claim 8 wherein the low frequency is less than or equal to about 10 kHz.

10. A computer-readable medium of claim 8 wherein the predetermined impedance phase value is less than or equal to about 90 degrees.

11. A computer-readable medium of claim 7 wherein the predetermined frequency is less than or equal to about 1 Hz.

12. A computer-readable medium of claim 7 further comprising the step of outputting a result of the determination.

13. A data processing system for identifying a wire damage on a wire, the data processing system comprising:
    a memory comprising a program that obtains a broadband impedance phase information for the wire, and determines whether the wire is damaged based on an impedance phase value of the wire at low frequency, obtains a broadband impedance magnitude information for the wire, and, when it is determined that the wire is damaged, determining a location of the wire damage based on an impedance magnitude value of the wire at low frequency by calculating a distance from a measurement point of the broadband impedance magnitude information to the wire damage using Equation (1)

$L_c = L|Z(\omega)|/R$ Equation (1), wherein $L_c$ represents the distance from a measurement point of the broadband impedance magnitude information to the wire damage, L represents a length of the wire, $|Z(\omega)|$ represents the broadband impedance magnitude information at a predetermined frequency $\omega$, and R represents a resistance at the wire damage; and
    a processing unit that runs the program.

14. A data processing system for identifying a wire damage on a wire, the data processing system comprising:
    means for obtaining a broadband impedance phase information for the wire;
    means for determining whether the wire is damaged based on an impedance phase value of the wire at low frequency;
    means for obtaining a broadband impedance magnitude information for the wire: and
    means for, when it is determined that the wire is damaged, determining a location of the wire damage based on an impedance magnitude value of the wire at low frequency by calculating a distance from a measurement point of the broadband impedance magnitude information to the wire damage using Equation (1)

$L_c = L|Z(\omega)|/R$ Equation (1), wherein $L_c$ represents the distance from a measurement point of the broadband impedance magnitude information to the wire damage, L represents a length of the wire, $|Z(\omega)|$ represents the broadband impedance magnitude information at a predetermined frequency $\omega$, and R represents a resistance at the wire damage.

* * * * *